United States Patent [19]
Perry

[11] Patent Number: 5,886,528
[45] Date of Patent: Mar. 23, 1999

[54] ELECTROSTATIC VOLTAGE METERING APPARATUS

[75] Inventor: Charles G. Perry, Lyndonville, N.Y.

[73] Assignee: Monroe Electronics, Inc., Lyndonville, N.Y.

[21] Appl. No.: 707,939

[22] Filed: Sep. 10, 1996

[51] Int. Cl.$^6$ ............................................. G01R 29/22
[52] U.S. Cl. .................... 324/457; 324/109; 324/679; 324/658; 324/72
[58] Field of Search .................... 324/679, 109, 324/457, 72, 658

[56] References Cited

U.S. PATENT DOCUMENTS

| | | | |
|---|---|---|---|
| 4,843,344 | 6/1989 | Cox | 330/264 |
| 4,853,639 | 8/1989 | Vosteen et al. | 324/457 |
| 4,878,017 | 10/1989 | Williams | 324/109 |
| 4,922,182 | 5/1990 | Cox | 324/682 |
| 4,973,910 | 11/1990 | Wilson | 324/109 |
| 5,323,115 | 6/1994 | Werner | 324/457 |

*Primary Examiner*—Josie Ballato
*Assistant Examiner*—Thomas Valone

*Attorney, Agent, or Firm*—Finnegan, Henderson, Farabow, Garrett & Dunner, LLP

[57] ABSTRACT

A handheld fieldmeter is implemented with an automatic function to drive the voltage on an output node of signal processing circuitry to circuit ground while a sensing electrode is disposed in a static-free environment. In response to a binary signal indicating whether the output node voltage is above or below ground, a microprocessor repeatedly increments/decrements a stored auto-zero multibit number, and generates successive PWM pulse streams of differing duty cycles determined by the incremented/decremented auto-zero number. The successive PWM pulse streams are integrated to ultimately produce fine zero adjustment current used by the signal processing circuitry to drive the output node voltage essentially to circuit ground. The fieldmeter also includes a pair of LEDs relatively positioned with the sensing electrode to emit light beams that intersect at the surface of a charged object when the sensing electrode is positioned a prescribed distance from the charged object. The LEDs are energized to emit their beams in alternation so as to provide a clear indication when the sensing electrode is so positioned by a user.

11 Claims, 1 Drawing Sheet ure. Manufacturing operations that involve continuous movements of web, sheet, particulate, and powder materials invariably pickup hazardous static charges, which must be safety dissipated. Thus, it is important to measure and monitor the static charges on these materials, so that appropriate grounding provisions can be implemented. Measurement of electrostatic charge is also necessary in the testing of ionizers and electrostatic precipitators.

ELECTROSTATIC VOLTAGE METERING APPARATUS

FIELD OF THE INVENTION

The present invention relates generally to fieldmeters, and particularly to non-contacting voltage metering apparatus for measuring electrostatic charge buildup on object surfaces.

BACKGROUND OF THE INVENTION

Numerous situations require close monitoring of static charge buildup on objects, including personnel, such as in the manufacture and testing of voltage sensitive electronic components and equipment, so that steps can be taken to establish a "static-free" electronic workshop. Manufacturing operations that involve continuous movements of web, sheet, particulate, and powder materials invariably pickup hazardous static charges, which must be safety dissipated. Thus, it is important to measure and monitor the static charges on these materials, so that appropriate grounding provisions can be implemented. Measurement of electrostatic charge is also necessary in the testing of ionizers and electrostatic precipitators.

All of these situations require that measurement of static charge buildup be conducted without contacting the material, otherwise the consequent charge dissipation will result in inaccurate voltage measurements and possible violent static discharge hazardous to personnel and equipment.

Non-contact fieldmeters or voltmeters are known in the art, such as exemplified by commonly assigned U.S. Pat. No. 4,853,639, the disclosure of which is incorporated herein by reference. Such prior art fieldmeters may be in the form of a handheld, battery-powered instrument that includes a probe or electrode, which is positioned to in the electrostatic field produced by a charged object and thus may be capacitively coupled with the charged object. The voltage produced on the probe, which is indicative of the electrostatic voltage on the object surface, is processed to generate a readout of the electrostatic voltage on, for example, a meter scale or an LCD display. Since the magnitude of the probe voltage is a function of its position in the electrical field, accurate voltage readings require that the probe be placed in predetermined spaced relation to the charged object.

Other important considerations for voltage reading accuracy include zero adjustment of the fieldmeter, which is frequently required Heretofore, fieldmeters have typically been equipped with a user adjustable potentiometer included in the electronic signal processing circuitry. To zero the voltage readout, the user positions the probe away from any charged objects and turns, for example, a thumbwheel linked to the zero-adjust potentiometer until a zero voltage readout is obtained. While this manual zero adjustment procedure is generally effective, it is nevertheless inconvenient and time consuming.

SUMMARY OF THE INVENTION

It is accordingly an objective of the present invention to provide an improved electrostatic voltage metering apparatus.

A further objective is to provide provisions for reliably indicating to a user when the apparatus of the present invention is located at the appropriate measurement position relative to a charged object for accurate voltage readings.

Yet another objective of the present invention is to provide electrostatic voltage metering apparatus of the above character having provisions for automatically zeroing signal processing circuitry of the apparatus.

Additional objectives and advantages of the invention will be set forth in the description that follows, and in part will be apparent from the description, or may be learned by practice of the invention. The objectives and other advantages will be realized and attained by the apparatus and method particularly pointed out in the written description and claims hereof, as well as the appended drawings.

To achieve these and other advantages, and in accordance with the invention, as embodied and broadly described, the invention is directed to apparatus for metering an electrostatic voltage on the surface of a charged object, comprising, in combination, a sensing electrode for location within an electric field at a prescribed distance from the charged object surface, whereby an input signal voltage, indicative of the electrostatic voltage on the charged object surface, is induced on the sensing electrode; at least one amplifier connected to the sensing electrode for amplifying the input signal voltage; an integrator for integrating the amplified input signal voltage appearing on an input node to produce an output signal voltage on an output node, the output voltage having a magnitude and polarity indicative of the electrostatic voltage on the charged object surface; and an auto-zero circuit for adjusting any voltage appearing on the output node to a zero reference potential when the sensing electrode is removed from the electric field, the auto-zero circuit including a comparator connected to the output node for generating a binary signal indicating whether any voltage on the output node is positive or negative relative to the zero reference potential; and a processor responsive to the binary signal from the comparator for generating an output effective to adjust a voltage level on the input node, such that the voltage on the output node is driven to the zero reference potential by the integrator.

In another aspect, the invention is directed to apparatus for metering an electrostatic voltage on the surface of a charged object, comprising, in combination, a sensing electrode for location within an electric field at a prescribed distance from the charged object surface, whereby an input signal voltage, indicative of the electrostatic voltage on the charged object surface, is induced on the sensing electrode; electronic circuitry for processing the input signal voltage to produce an output signal voltage; a display for providing a visual readout of the electrostatic voltage on the charged object surface in accordance with the output signal voltage; and a range finder positioned in predetermined fixed relation to the sensing electrode, the range finder comprising a pair of spaced light sources arranged to emit angularly directed light beams toward the charged object, the light beams intersecting at the charged object surface when the sensing electrode is precisely located at the prescribed distance from the charged object surface; and an electrical source connected to energize the light source in alternation, whereby the light beams emitted by the light sources produce separate, pulsating beam spots on the charged object surface that merge into a single, uniformly lighted beam spot only when the sensing electrode is precisely located at the prescribed distance from the charged object surface.

It is to be understood that both the foregoing general description and the following detailed description are exemplary and explanatory and are intended to provide further explanation of the invention as claimed.

The accompanying drawing is included to provide a further understanding of the invention and is incorporated in and constitutes a part of the specification, illustrates one embodiment of the invention and, together with the description, serves to explain the principles of the invention.

BRIEF DESCRIPTION OF THE DRAWINGS

The sole FIGURE of the drawing is a circuit diagram, partially in block form, of an electrostatic voltage metering apparatus in accordance with a preferred embodiment of the present invention.

DETAILED DESCRIPTION OF THE PREFERRED EMBODIMENT

Figure 1:
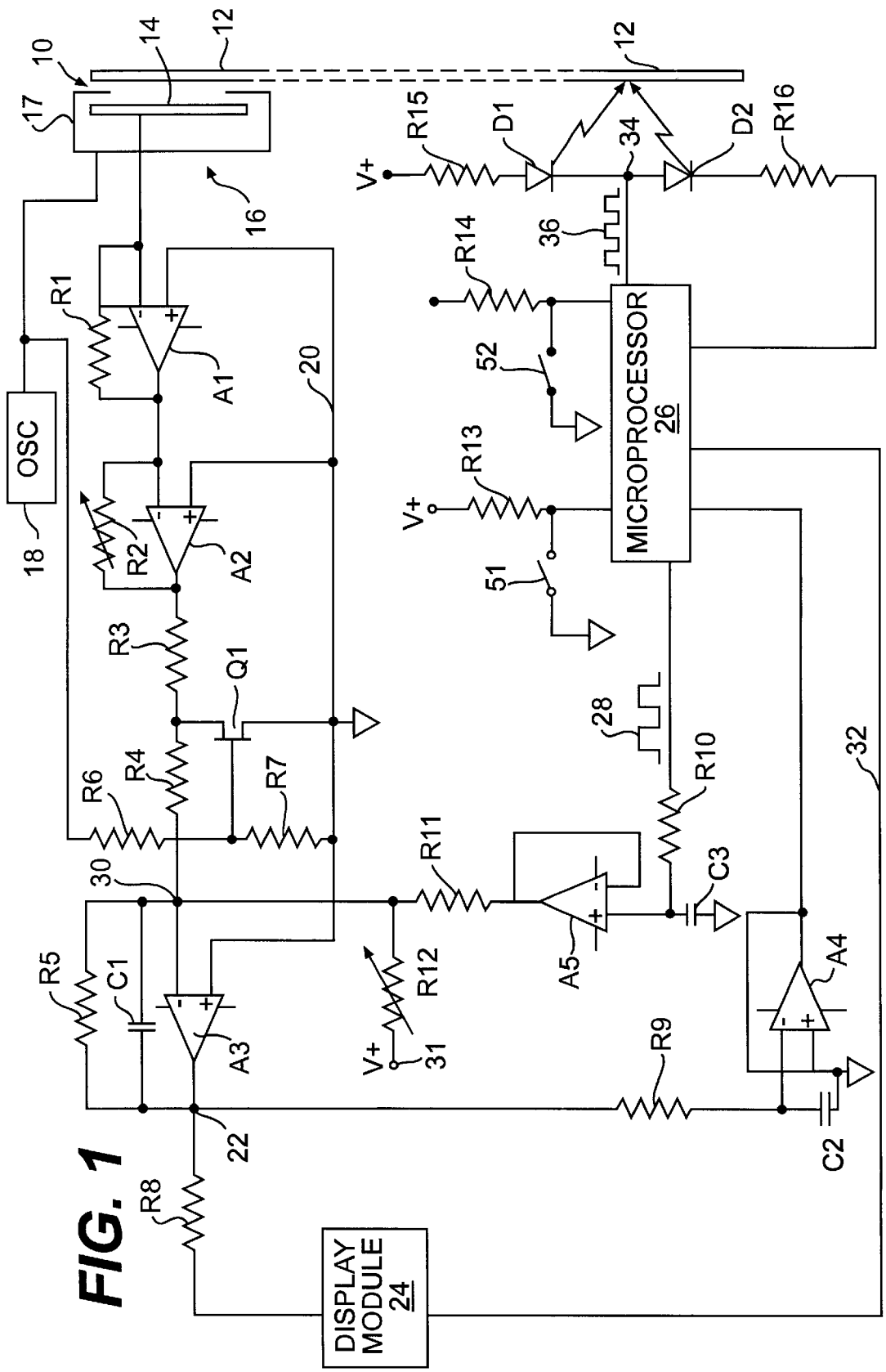

Reference will now be made in detail to the preferred embodiment of the present invention, an example of which is illustrated in the sole FIGURE of the drawing. As seen in the drawing, the electrostatic voltage metering apparatus of the invention, which may be implemented as a battery-powered, handheld fieldmeter, comprises a probe, generally indicated at 10, for providing a reading of electrostatic voltage accumulated on the surface of an object 12. The probe includes a voltage sensing electrode 14, which is located in predetermined spaced relation to the surface of charged object 12, such as to be within the electric field produced by the object and thus be capacitively coupled therewith. This capacitive coupling is modulated by suitable means, such as a tuning fork mechanism of the type disclosed in U.S. Pat. No. 3,921,087. The disclosure of this patent is incorporated herein by reference. This tuning fork mechanism, generally indicated at 16, is driven at an appropriate frequency by an oscillator 18, such as to vibrate electrode 14 or a conductive vane 17, also situated in the electric field, and thereby mechanically modulate the capacitive coupling between the sensing electrode and charged object 12. This modulated capacitive coupling induces a modulated voltage on sensing electrode 14, which serves as an input signal voltage indicative of the electrostatic voltage on charged object 12.

The modulated input signal voltage on electrode 14 is applied to the inverting input of an operational amplifier A1, configured as a preamplifier with a feedback resistor R1 and its non-inverting input connected to a circuit ground on bus 20. The output of signal amplifier A1 is applied to the inverting input of an operational amplifier A2, configured as a high gain, wideband amplifier with a feedback resistor R2 in the form of a potentiometer for factory calibration adjustment and its non-inverting input connected to bus 20. Since the input signal voltage on electrode 14 is induced by typically small capacitive variations, on the order of picofarads, it is necessary to minimize capacitive loading and thus preserve this sensing electrode induced voltage. Accordingly, amplifier A1 is a wideband amplifier with extremely high input resistance and low input capacitance.

The output of high gain amplifier A2 is fed through a series-connected pair of resistors R3 and R4 to the inverting input of an operational amplifier A3 implemented as an integrator. Thus, the output and inverting input of amplifier A3 are interconnected by the parallel combination of a resistor R6 and a capacitor C1 and its noninverting input is connected to bus 20.

However, the amplified input signal voltage must first be demodulated before integration by amplifier A3. To this end, the junction between resistors R3 and R4 is connected to circuit ground bus 20 through the source-drain circuit of an FET transistor Q1. The gate of this transistor is connected to the junction between resistors R6 and R7, which are connected in a signal path between the output of oscillator 18 and bus 20. Thus, transistor Q1 is turned on and off in synchronism with the oscillator output that drives the capacitive modulating tuning fork mechanism 16. The result is that the conduction times of transistor Q1 are controlled, such as to half-wave demodulate the modulated input signal voltage at the output of amplifier A. This demodulated input signal voltage is integrated by amplifier A3 to produce an analog voltage signal on output node 22 of a magnitude and polarity relative to the circuit common voltage on bus 20, that is indicative of the magnitude and polarity of the voltage on the surface of charged object 12. This analog signal is fed through a resistor R8 to a display module 24, where it is converted to a digital signal, temporarily stored in a display register, and displayed as a digital readout of the positive or negative electrostatic voltage on charged object 12.

Each time the apparatus is powered up to take voltage readings and occasionally during prolonged use, it is necessary for reading accuracy to ensure that the voltage appearing on output node 22 is in fact zero when sensing electrode 14 is not in the presence of an electric field. Thus, prior to taking a voltage reading, sensing electrode 14 is situated in a non-electric field environment. If the apparatus is in proper zero adjustment, the voltage appearing on output node is zero relative to circuit ground on bus 20. If not, zero adjustment is called for. As noted above, prior art fieldmeters required a manual adjustment to zero-adjust the meter circuitry. In accordance with a feature of the present invention, the apparatus seen in the drawing is equipped with an automatic zero adjustment capability.

To this end, output node 22 is also connected to circuit ground through a resistor R9 and a capacitor C2. Thus, any spurious voltage appearing on the output node is stored on capacitor C2. The junction between resistor R9 and capacitor C2 is connected to the inverting input of an operational amplifier A4. The non-inverting input is connected to circuit ground. Amplifier A4 compares the voltage on capacitor C2 to circuit ground and generates a low output (circuit ground), if this capacitor voltage is positive relative to circuit ground. Conversely, if the voltage on capacitor C2 is negative relative to circuit ground, amplifier A4 generates a high output. Thus, amplifier A4 serves to detect whether the output voltage on node 22 is positive or negative relative to circuit ground and to generate a binary signal accordingly.

This binary output signal from amplifier A4 is fed to a microprocessor 26, which may, for example, be programmed to increment or decrement a digital number held in an internal register (not shown). The incremented or decremented number can then be used by the microprocessor as a basis for generating a pulse width modulated stream of voltage pulses of a predetermined duty cycle, indicated at 28, which is fed to an integrating circuit consisting of a resistor R10 and a capacitor C3 connected in series to circuit ground. The integration of pulse stream 28 produces a voltage on capacitor C3 of a magnitude indicative of the particular pulse width modulation duty cycle imposed on the pulse stream by the microprocessor. The voltage on capacitor C3, appearing at its junction with resistor R10, is applied to the non-inverting input of an operational amplifier A5, configured as a high impedance buffer with its inverting input and output directly interconnected. The output of amplifier A5 is also connected through a resistor R11 to a node 30 included in the signal path from amplifier A2 to the inverting input of amplifier A3. A potentiometer R12, connected into a junction between node 30 and resistor R11 from a positive supply voltage terminal 31, is factory set to provide course zero adjustment current to node 30. Amplifier A5 functions with resistor R11 as a voltage-to-current converter to add or subtract current from this course zero adjustment current according to the voltage on capacitor C3 in order to automatically effect a precise zero adjustment of the output voltage on node 22.

As an example of how microprocessor 26 may be programmed to execute an auto-zero function in accordance with the present invention when initiated by a user, if the voltage on capacitor C2 is positive relative to circuit ground, the output of amplifier A4 goes to a low binary signal level. In response, microprocessor 26 increments the multibit auto-zero number remaining in its internal register that resulted when the apparatus was last auto-zeroed. To expedite the auto-zero function, the step increment for the first microprocessor execution cycle of an auto-zero function is preset to a large number. Based on the incremented number in the register, which may be a ten-bit number, the microprocessor refers to a lookup table to locate an associated pulse width modulation duty cycle for pulse stream 28 that is effective to rapidly raise the voltage on integrating capacitor C3. Amplifier A5 injects proportionately more current into node 30, and amplifier A3 pulls the voltage on output node 22 downwardly toward circuit ground potential. If the voltages on capacitor C2 and hence on output node 22 remain above circuit ground, microprocessor 26, during the next execution cycle, again increments the multibit number in its register by the same large number and determines from the lookup table a new pulse width modulation duty cycle for pulse stream 28 associated with the incremented number. The voltage on integrating capacitor C3 is increased, as is the current injected into node 30.

The same large number incrementation of the register number is repeated for each subsequent execution cycle until the voltage on output node 22 is driven negatively relative to circuit ground. This negative output voltage, replicated on capacitor C2, causes the binary signal output of amplifier A4 to go high. In response, microprocessor 26 then decrements the number in its internal register by a programmed smaller number for the next microprocessor execution cycle. From the lookup table, the microprocessor finds another pulse width modulation duty cycle associated with the decremented number and appropriate to reduce the voltage on capacitor C3 by a programmed amount. Current into node 30 is reduced to raise the output node voltage toward circuit ground.

As long as the output voltage remains negative relative to circuit ground, the register number is uniformly decremented during subsequent execution cycles until a crossing of circuit ground by the output node voltage is detected by amplifier A4. Then, microprocessor 26 increments the register number by yet a smaller number to select a programmed pulse width modulation duty cycle effective to pull the output node 22 back down toward circuit ground. This operation is repeated during subsequent execution cycles with successively smaller programmed number decrements and increments with each circuit ground crossing of the output node voltage until it settles (hunts) to essentially circuit ground as indicated by the voltage readout produced by display module 24, whereupon the user terminates the auto-zero function. Thereafter, the final number residing in this auto-zero register is used by the microprocessor to periodically regenerate the pulse width modulated pulse stream 28 at the associated duty cycle, as determined from the lookup table, so as to maintain the voltage on integrating capacitor C3 at the value required to hold the auto-zero adjustment effective to zero the voltage on output node 22 when sensing electrode 14 is disposed in a non-electric field (static free) environment.

It will be appreciated that the same routine is followed by the microprocessor if the output node voltage is detected as being below circuit ground upon user initiation of auto-zero function. In this case, the binary signal output of amplifier A4 goes to a high binary level, and thus the stored multibit number is decremented by the same large number in the first execution cycle.

In accordance with a feature of the present invention, the auto-zero function may be initiated by holding a pushbutton switch S1 in its closed position. When the auto-zero function has been completed to the user's satisfaction, switch S1 is released to assume its normally open position, thereby signaling the microprocessor to terminate the auto-zero function. As seen in the drawing, one terminal of switch S1 is connected to the junction between a resistor R13 and a pin of microprocessor 26. The other terminal of this switch is connected to circuit ground, while the other end of resistor R13 is connected to positive supply voltage V. Microprocessor 26 is programmed to execute the auto-zero function while switch S1 is held closed, as described above, and to wake from a sleep mode in response to momentary switch closure. Thus, switch S1 serves the dual role of an ON switch and an auto-zero function switch.

A second, normally open pushbutton switch S2 is connected at one terminal to the junction of a resistor R14 and another pin of microprocessor 26. The other switch terminal is connected to circuit ground, and the upper end of resistor R14 is connected to positive supply voltage V. The microprocessor is programmed to interpret a prolonged closure, e.g., at least three seconds, of switch S2 as a user instruction to turn off (in practice, assume a sleep mode, drawing trickle battery current to preserve microprocessor register contents, particularly the auto-zero register number). A momentary closure of switch S2 is interpreted by microprocessor 26 as a user instruction to hold a voltage reading displayed by display module 24. Thus, upon momentary closure of switch S2, the microprocessor signals display module 24 over lead 32 to freeze the current voltage reading displayed on its display. To release this hold function, the user simply momentarily closes switch S2, and the apparatus is conditioned by the microprocessor to take another voltage reading.

Since voltage readings are a function of the spacing between the surfaces of charged object 12 and sensing electrode 14, accuracy of the voltage readings requires that the handheld apparatus be precisely located in a measurement position that locates the sensing electrode a prescribed distance (for which the amplifier circuit is calibrated) from the charged object. To assist the user in locating the apparatus at this requisite measurement position, a pair of range finder, light emitting diodes D1 and D2 are provided. These diodes are mounted by the apparatus housing beside sensing electrode 14 in a manner such that their light beams, angularly directed toward the charged object 12, intersect at the charged object surface when sensing electrode 14 is the prescribed distance from the same surface of the charged object when the apparatus is located in the measurement position.

As seen in the drawing, diodes D1 and D2 are connected in a series circuit including a resistor R15 connecting the anode of diode D1 to positive supply voltage V and a resistor R16 connecting the cathode of diode D2 to a pin of microprocessor 26. This microprocessor pin is held at circuit ground while voltage readings are being taken, but may be open circuited by the microprocessor to interrupt the diode energizing circuit at other times, such as during a hold function, to conserve battery power.

In accordance with a feature of the present invention, a node 34 between the cathode of diode D1 and the anode of diode D2 is connected to a microprocessor pin. The microprocessor is programmed to generate on this pin a square wave pulse stream 36 alternating at a suitable frequency, e.g., one-quarter to one-half Hertz, between positive supply voltage V and circuit ground. It is thus seen that, during each pulse, no current flows through diode D1, and it thus does not emit a light beam. At the same time, however, the pulse voltage on node 34 is at positive supply voltage V, and thus current flows through diode D2, causing it to emit a light beam. During the intervals between pulses of pulse stream 36, it is seen that current flows through diode D1, but not through diode D2. Thus, the light beams are emitted by diodes D1 and D2 in alternation at the frequency of pulse stream 36.

By virtue of this range finding feature of the present invention, as the handheld apparatus is moved into the measurement position, the beams emitted by diodes D1 and D2 appear as separate pulsating light spots on the surface of charged object 12. The separation between the pulsating light spots is an indication of how far the apparatus is removed from the measurement position. As the sensing electrode approaches the prescribed distance from the charged object, the light spots converge and then merge into a single, uniformly lighted spot on the charged object surface when the apparatus has precisely assumed the measurement position with sensing electrode 14 a prescribed distance, e.g., one inch, from the charged object surface. It will be appreciated that this range finder feature of the invention enables the user to precisely locate the handheld apparatus in the requisite measurement position, thus ensuring an accurate reading of the electrostatic voltage on charged object 12.

It will be apparent to those skilled in the art that various modifications and variations can be made in the electrostatic voltage metering apparatus of the present invention without departing from the spirit or scope of the invention. Thus, it is intended that the present invention cover modifications and variations of this invention, provided they come within the scope of the appended claims and their equivalents.

What is claimed is:

1. Apparatus for metering an electrostatic voltage on a surface of a charged object, the apparatus comprising, in combination:
   a sensing electrode for location within an electric field at a prescribed distance from the charged object surface, whereby an input signal voltage, indicative of the electrostatic voltage on the charged object surface, is induced on the sensing electrode;
   at least one amplifier connected to the sensing electrode for amplifying the input signal voltage;
   an integrator for integrating the amplified input signal voltage appearing on an input node to produce an output signal voltage on an output node, the output voltage having a magnitude and polarity indicative of the electrostatic voltage on the charged object surface; and
   an auto-zero calibration circuit for adjusting any voltage appearing on the output node to a zero reference potential when the sensing electrode is removed from the electric field prior to a metering operation, the auto-zero circuit including:
      a comparator connected to the output node for generating a binary signal indicating whether any voltage on the output node is positive or negative relative to the zero reference potential;
      a microprocessor responsive to the binary signal from the comparator for generating an output effective to adjust a voltage level on the input node of the integrator, such that the voltage on the output node of the integrator is driven to the zero reference potential by the integrator.

2. The apparatus defined in claim 1, wherein the auto-zero circuit further includes a voltage-to-current converter having an input connected to receive the processor output and an output connected to inject or remove current from the input node.

3. The apparatus defined in claim 1, wherein the auto-zero circuit further includes an integrating circuit for performing a voltage integration of the processor output over time to produce an integrated voltage, and a high impedance buffer connected between the input node and the integrating circuit for varying a zero-adjust current to the input node according to the integrated voltage.

4. Apparatus for metering an electrostatic voltage on a surface of a charged object, the apparatus comprising, in combination:
   a sensing electrode for location within an electric field at a prescribed distance from the charged object surface, whereby an input signal voltage, indicative of the electrostatic voltage on the charged object surface, is induced on the sensing electrode;
   at least one amplifier connected to the sensing electrode for amplifying the input signal voltage;
   an integrator for integrating the amplified input signal voltage appearing on an input node to produce an output signal voltage on an output node, the output voltage having a magnitude and polarity indicative of the electrostatic voltage on the charged object surface; and
   an auto-zero circuit for adjusting any voltage appearing on the output node to a zero reference potential when the sensing electrode is removed from the electric field, the auto-zero circuit including:
      a comparator connected to the output node for generating a binary signal indicating whether any voltage on the output node is positive or negative relative to the zero reference potential;
      a processor responsive to the binary signal from the comparator for generating an output effective to adjust a voltage level on the input node, such that the voltage on the output node is driven to the zero reference potential by the integrator, the processor including means to generate the output as a pulse width modulated pulse stream; and
      an integrating circuit for performing a voltage integration of the processor output over time to produce an integrated voltage, and a high impedance buffer connected between the input node and the integrating circuit for varying a zero-adjust current to the input node according to the integrated voltage.

5. The apparatus defined in claim 4, wherein the processor further includes means to:
   store a multibit number,
   increment/decrement the multibit number according to a binary level of the binary signal from the comparator, and
   differentially pulse width modulate the pulse stream according to the incremented/decremented multi bit number.

6. The apparatus defined in claim 5, wherein the processor further includes means, upon user initiation of an auto-zero function, to:
   increment/decrement the stored multibit number by a large number during a first execution cycle, repeat the large number increment/decrement during subsequent execution cycles until the binary signal from the comparator changes binary level, progressively reducing the size of the increment/decrement number during subsequent execution cycles each time the binary signal changes binary level, and progressively adjusting a pulse width modulation duty cycle of the pulse stream according to the incremented/decremented multibit number existing during each execution cycle, such as to progressively drive the voltage on the output node essentially to the zero reference potential.

7. The apparatus defined in claim 6, wherein the processor further includes means to periodically regenerate the pulse width modulated pulse stream of a duty cycle associated with the incremented/decremented number stored by the processor at the time of user termination of the auto-zero function.

8. The apparatus defined in claim 1, further including a display module connected to the output node for converting the output signal voltage to a visual readout of the electrostatic voltage on the charged object surface.

9. The apparatus defined in claim 1, further including:

a modulator operating to modulate a capacitive coupling between the sensing electrode and the charged object, whereby to produce a modulated input signal voltage on the sensing electrode that is amplified by the amplifier, and a demodulator connected to an output of the amplifier and controlled by the modulator for demodulating the amplified modulated input signal voltage.

10. The apparatus defined in claim 9, wherein the demodulator includes a switching transistor connected between the amplifier output and a circuit ground bus and controlled by the modulator to half-wave demodulate the amplified, modulated input signal voltage.

11. Apparatus for metering an electrostatic voltage on a surface of a charged object, the apparatus comprising, in combination:

a sensing electrode for location within an electric field at a prescribed distance from the charged object surface, whereby an input signal voltage, indicative of the electrostatic voltage on the charged object surface, is induced on the sensing electrode;

at least one amplifier connected to the sensing electrode for amplifying the input signal voltage;

an integrator for integrating the amplified input signal voltage appearing on an input node to produce an output signal voltage on an output node, the output voltage having a magnitude and polarity indicative of the electrostatic voltage on the charged object surface;

a range finder positioned in predetermined fixed relation to the sensing electrode, the range finder comprising a pair of spaced, light emitting diodes arranged to emit angularly directed light beams toward the charged object, the light beams intersecting at the charged object surface when the sensing electrode is precisely located at the prescribed distance from the charged object surface, a microprocessor connected to control energization of the light emitting diodes in alteration, whereby the light beams emitted by the light emitting diodes produce separated, pulsating beam spots on the charged object surface that merge into a signal uniformly lighted beam spot only when the sensing electrode is located at the prescribed distance from the charged object surface; and an auto-zero circuit for adjusting any voltage appearing on the output node to a zero reference potential when the sensing electrode is removed from the electric field, the auto-zero circuit including:

a comparator connected to the output node for generating a binary signal indicating whether any voltage on the output node is positive or negative relative to the zero reference potential;

the microprocessor responsive to the binary signal from the comparator for generating an output effective to adjust a voltage level on the input node, such that the voltage on the output node is driven to the zero reference potential by the integrator.

* * * * *